United States Patent
Schultheiss

(10) Patent No.: US 7,853,419 B2
(45) Date of Patent: Dec. 14, 2010

(54) SIGNAL PROCESSING CIRCUIT AND METHOD FOR PROCESSING AN HF INPUT SIGNAL

(75) Inventor: Volker Schultheiss, Graz (AT)

(73) Assignee: Infineon Technologies AG, Munich (DE)

( * ) Notice: Subject to any disclaimer, the term of this patent is extended or adjusted under 35 U.S.C. 154(b) by 591 days.

(21) Appl. No.: 11/535,748

(22) Filed: Sep. 27, 2006

(65) Prior Publication Data

US 2007/0202831 A1 Aug. 30, 2007

(30) Foreign Application Priority Data

Sep. 28, 2005 (DE) ........................ 10 2005 046 398

(51) Int. Cl.
*G01R 23/00* (2006.01)
(52) U.S. Cl. .................... 702/75; 702/189; 702/190; 702/191; 702/197
(58) Field of Classification Search .................. 702/75, 702/76, 66–67, 189, 190, 191, 195, 197; 455/130, 131, 150.1, 205, 210, 216, 295, 455/313; 324/76.19, 76.24; 329/315, 318, 329/320, 343
See application file for complete search history.

(56) References Cited

U.S. PATENT DOCUMENTS

| | | | | |
|---|---|---|---|---|
| 4,755,761 A | * | 7/1988 | Ray, Jr. | 329/323 |
| 4,778,853 A | | 10/1988 | Belfoure | 525/67 |
| 5,574,456 A | * | 11/1996 | Cho | 341/157 |
| 6,784,822 B1 | * | 8/2004 | Nix et al. | 341/161 |
| 6,876,844 B1 | * | 4/2005 | Wong | 455/316 |
| 2005/0186930 A1 | * | 8/2005 | Rofougaran et al. | 455/260 |

OTHER PUBLICATIONS

Intersil, Digital IF Subsampling Using the HI5702, May 1998, Intersil Corporation 2000, p. 3-1.*

* cited by examiner

*Primary Examiner*—Hal D Wachsman
*Assistant Examiner*—Ricky Ngon
(74) *Attorney, Agent, or Firm*—Eschweiler & Associates, LLC

(57) ABSTRACT

A signal processing circuit and a method for processing an HF input signal are described, having an HF receiver for generating an IF signal on an intermediate frequency from an HF input signal, a frequency divider for generating a signal from the IF signal or a signal derived from the IF signal, with a frequency reduced compared with the intermediate frequency, and a sampling unit for sampling the signal with the reduced frequency by using a sampling frequency, wherein the sampling frequency is smaller than the double intermediate frequency, and wherein the frequency divider divides the intermediate frequency such that the reduced frequency and the sampling frequency are spaced such that the sampling theorem is fulfilled at least for the first odd-numbered harmonic of the signal with the reduced frequency.

29 Claims, 5 Drawing Sheets

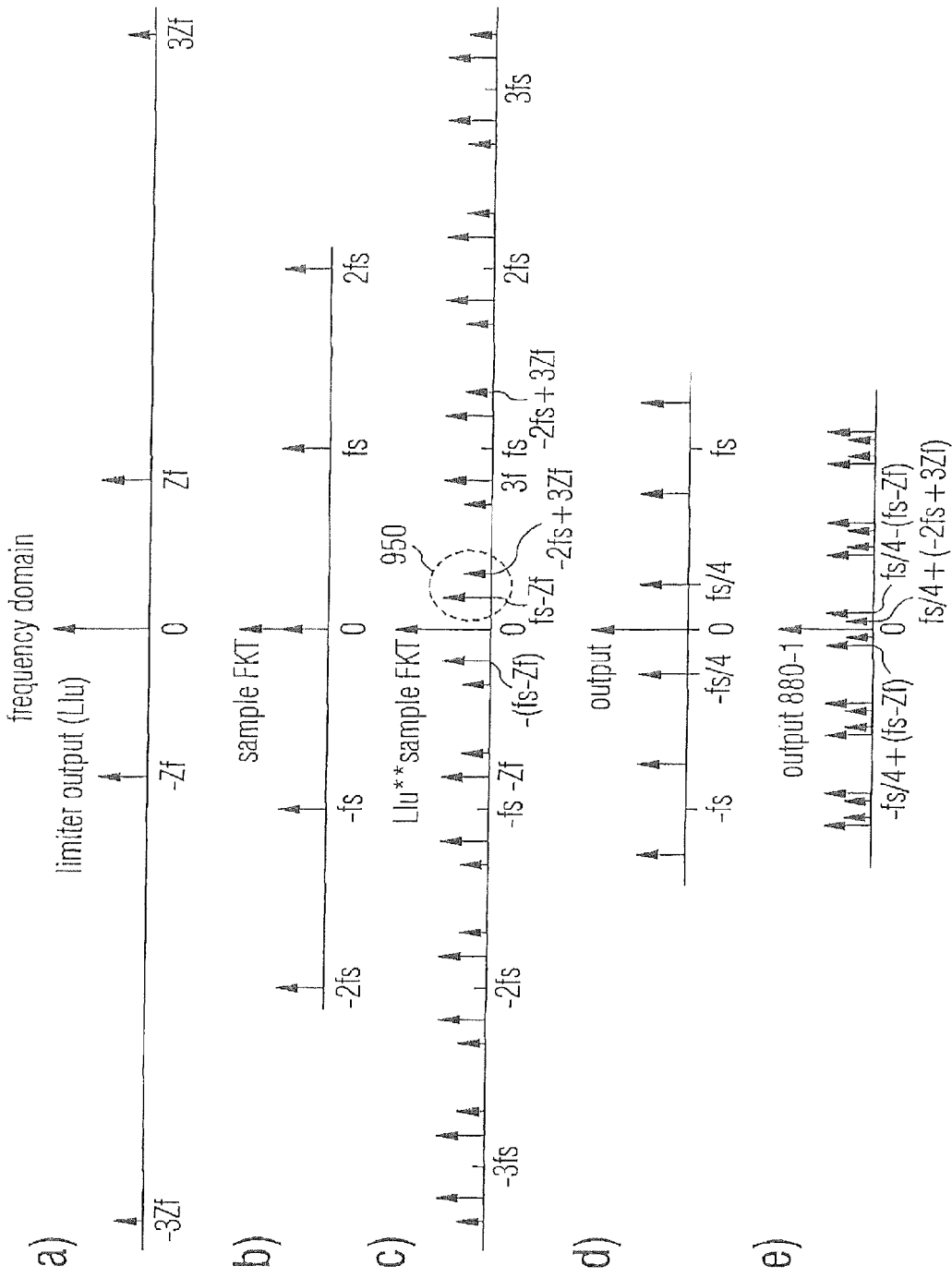

US 7,853,419 B2

SIGNAL PROCESSING CIRCUIT AND METHOD FOR PROCESSING AN HF INPUT SIGNAL

PRIORITY

This application claims priority from German Patent Application No. 10 2005 046 398.3, which was filed on Sep. 28, 2005, and is incorporated herein by reference in its entirety.

TECHNICAL FIELD

The present invention relates to a signal processing circuit and a method for processing an HF input signal, particularly a signal processing circuit and a method, which is part of a system for demodulating a frequency-modulated signal (FM signal).

BACKGROUND

Receiver architectures for frequency-modulated signals or FM signals, respectively, based on a limiting circuit and using digital frequency modulators are known, where an intermediate frequency (IF) is used, which is close to the sampling frequency of the receiver architecture. Such a procedure, where the sampling frequency differs only slightly from a frequency of a signal to be sampled, is referred to as subsampling and can only be applied in a few selected cases of frequency constellations. For the present case of a receiver architecture for frequency-modulated signals based on a limiting circuit and digital frequency-demodulator circuit, which operates at a sampling frequency close to the intermediate frequency, this means that the circuit can only be used in very limited frequency constellations in the intermediate frequency and the sampling frequency.

FIG. 4 shows a digital FM demodulation circuit 800, which combines the concept of subsampling with a delay and multiply FM demodulator. Such a solution is, for example, implemented in the electronic device TDA5230. Here, the circuit 800 has an analog input circuit 810 in an HF range with an input 810a for an HF signal, and an output 810b for an IF signal, wherein HF stands for high frequency and IF for intermediate frequency. The IF signal provided at the output 810b of the analog input circuit 810 is supplied to an input of an IF filter 820 in the IF range of the circuit 800. An output of the IF filter 820 is connected to an input of a limiting circuit 830. Thus, a connection, which connects an output of the limiting circuit 830 to an input of a sampling means 850, which is also referred to as sampler in FIG. 4, carries a one bit data stream with a frequency corresponding to the intermediate frequency of the IF signal. Apart from the sampling means 850, a sampling and digital demodulation range of the signal processing circuit 800 comprises a so-called zero IF mixer 860 and a filter and demodulation circuit 870. Thereby, the zero IF mixer 860 is connected between the output of the sampling means 850 and the first and second input of the filter and demodulation circuit 870, which provides a non-phase-shifted output signal (I path) and an output signal shifted by 90° (Q path) of the zero IF mixer 860 of the filter and demodulation circuit 870. The zero IF mixer 860 has a first internal IQ mixer 880-1, and a second internal IQ mixer 880-2, which are connected in series, a sine-wave generator 890 and a numerical controlled oscillator 900. The filter and demodulation circuit 870 has a first CIC filter 910-1 for the I path and a second CIC filter 910-2 for the Q path as low-pass filter, as well as a delay and multiply demodulator 920. Thus, a sampling and digital demodulation range comprises the sampler 850, the zero IF mixer 860 and the filter and demodulation circuit 870.

Below, the mode of operation of the signal processing circuit 800 will be briefly discussed. An HF signal supplied to the input 810a of the analog input circuit 810 is downconverted by the input circuit 810 to the IF signal with an intermediate frequency, which is smaller than the frequency of the HF signal. The IF signal provided at the output 810b of the input circuit 810 is transformed into a signal derived from the IF signal in the IF range of the signal processing circuit 800, which means by the IF filter 820 and the limiting circuit 830. The output signal of the limiter 830 is referred to as 1 bit data stream@IF in FIG. 4. This output signal is then sampled with a sampling frequency $f_s$ in the sampling means 850, and supplied to the zero IF mixer and the filter and demodulation circuit 870 for further processing. The sampling frequency $f_s$ is thereby by a factor k higher than the intermediate frequency IF. Thus, the sampling frequency $f_s$ and the intermediate frequency fulfill the relation $$f_s = k \cdot IF.$$

As has already been mentioned, the signal processing circuit 800 is based on the principle of the subsampling approach. By subsampling, the prior art and the present invention mean that the sampling frequency $f_s$ is smaller than the double of a signal frequency, or in the present case the frequency of the IF signal IF, respectively, which means that the numerical factor k is <2, so that the sampling theorem or the Nyquist-Shannon sampling theorem is violated.

The two IQ mixers 880-1 and 880-2 of the zero IF mixer 860 serve to mix the output signal of the sampling means 850 to approximately zero with regard to the frequency. For that purpose, a first mixing frequency is provided to the first IQ mixer 880-1 by the sine-wave generator, which corresponds to a quarter of the sampling frequency or system frequency $f_s$, respectively. The final mixing to approximately zero is obtained with the second IQ mixer 880-2, to which a second mixing frequency is provided by the numerical controlled oscillator 900. The two output signals of the zero IF mixer 860 are filtered by the two CIC filters 910-1 and 910-2 in the filter and demodulation circuit 870. Then, demodulation is performed in the delay and multiply demodulator 920.

Due to the fact that a square wave signal has all odd-numbered harmonics or harmonic waves apart from the fundamental wave, the sampling function, which is effected by the sampling means 850, convolves the fundamental wave with all odd-numbered harmonics of the output signal of the limiting circuit 830.

This method, which means the method of subsampling, functions only in special circumstances, when a special relation between the sampling frequency of the sampling means 850 and the signal frequency, which means in this case the frequency of the digital IF signal $f_{IF}$, is fulfilled, because only in this case a sufficient distance can be maintained in the frequency range between the fundamental wave and the higher harmonics after convolution, which is a consequence of the sampling process.

Special relations between the sampling frequency and the intermediate frequency occur across a large range of sampling frequencies and intermediate frequencies. In this case, it can happen that the higher harmonics of the digital IF signal are very close to the fundamental wave, or, in the worst case, even have the same frequency, respectively, after sampling in the frequency range. This can result in a heavy distortion of the following demodulation of the signal and thus a high bit error rate, for example in the case of FSK signal detection (frequency shift keying). Thus, the reception of a data stream can even be made completely impossible.

FIG. 5 shows a frequency distribution or frequency plan, respectively, of signals occurring in the circuit of FIG. 4. FIG. 5a shows the frequency distribution of the IF signal at the output of the limiting circuit or the output of the limiter 830, respectively. In the following, the signal at the output of limiter 830 in FIG. 5 is also referred to as LIM. FIG. 5b shows the frequency distribution of the sampling function. FIG. 5c shows the frequency distribution, which results by the convolution of the signal LIM with the sampling function (sampling FKT) resulting during sampling. FIG. 5d shows the frequency distribution of a signal, which the sine-wave generator 890 provides to the first internal mixer 880-1 of the zero IF mixer 860. This signal has a frequency, which corresponds to a quarter of the sampling frequency $f_s$. FIG. 5e shows the frequency distribution of a signal at an output of the first internal mixer 880-1 of the zero IF mixer 860, wherein the frequency distribution is a result of mathematical convolution of the signal at the output of the sampling means 850, and a multiplication of the signal of the sine-wave generator 890 with the frequency $f_s/4$.

In other words, FIG. 5 shows the frequency distribution or the frequency plan, respectively, of the fundamental wave and the third harmonic, which represents the first odd-numbered harmonic of the digital IF signal, after sampling and mixing in the first stage of the zero IF mixer 860. The five frequency axes of the samples 5a to 5e are scaled identically and are illustrated without being displaced to each other. Both the positions and the distances on the frequency axis can thus be transferred by a vertical displacement between the partial emitters. In other words, the distances between the third harmonics or the first odd-numbered harmonic and the fundamental wave are defined in relation to the sampling frequency and the intermediate frequency of the IF signal.

Based on the convolution of the sampling function, which is referred to as sample FKT in FIG. 5, and the IF signal, the frequency distribution of the signal at the output of the sampling means 850 shown in FIG. 5c results. In the case of subsampling as it is used here, the frequency distribution has, for example, a contribution at a frequency ($f_s$–Zf) at the output of the sampling means 850, which originates from the contribution of the digital IF signal at the frequency Zf and the contribution of the sampling function at the frequency $f_s$, and a contribution at the frequency (3Zf–2$f_s$) which originates from the first odd-numbered harmonic of the digital IF signal with frequency 3Zf and the contribution of the sampling function at a frequency of 2$f_s$. These two contributions in the frequency distribution of the signal at the output of the sampling means 850 are indicated with the reference number 950 in FIG. 5c, since they represent a critical range in the frequency band for the demodulation of the signal within an FSK signal detection (frequency shift keying) following the demodulation, since the intermediate frequency and the sampling frequency meet in a critical range. As has already been explained above, due to the low distance of the two contributions, heavy distortions can result in the demodulation following the sampling which can finally cause a high bit error rate.

Earlier solutions resulted in a very high hardware and development effort, which is reflected in high chip area requirements and high power consumption.

SUMMARY

For example, a lower bit error rate can be obtained by a signal processing circuit, having: an HF receiving means for generating an IF signal from an HF input signal on an intermediate frequency; a frequency divider for generating a signal from the IF signal or a signal derived from the IF signal with a frequency reduced compared with the intermediate frequency; and a sampling means for sampling the signal with the reduced frequency by sampling a frequency; wherein the sampling frequency is smaller than the double intermediate frequency; and wherein the frequency divider divides the intermediate frequency such that the reduced frequency and the sampling frequency are spaced such that the sampling theorem is fulfilled at least for the first odd-numbered harmonic of the signal with the reduced frequency.

BRIEF DESCRIPTION OF THE DRAWINGS

These and other objects and features of the present invention will become clear from the following description taken in conjunction with the accompanying drawings, in which:

FIG. 5 is a frequency plan of several signals of the possible signal processing circuit of FIG. 4.

DETAILED DESCRIPTION

Figure 1:
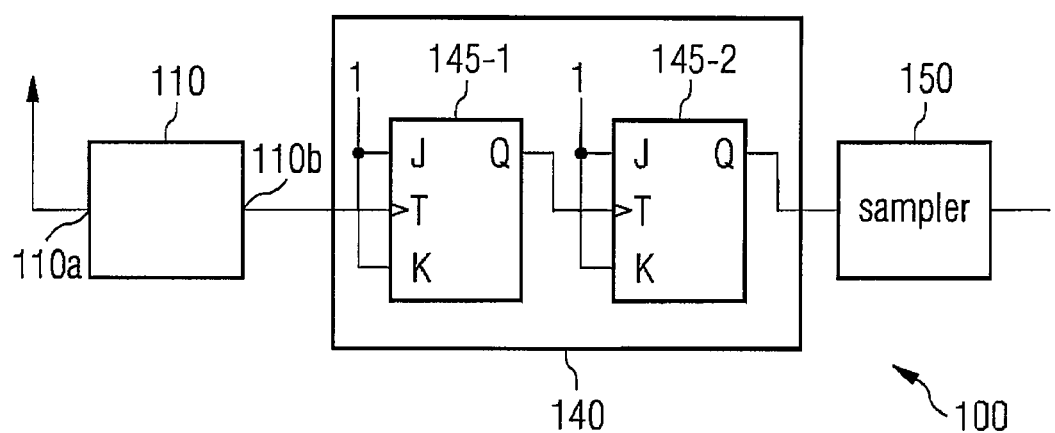
FIG. 1 is a block diagram of a first embodiment of a signal processing circuit.

In accordance with a second aspect, a method for processing an HF input signal, may have the steps of: generating an IF signal having an intermediate frequency, from the HF input signal; generating a signal from the IF signal or a signal derived from the IF signal with a frequency reduced compared with the intermediate frequency; and sampling the signal with the reduced frequency by using a sampling frequency, wherein the sampling frequency is smaller than the double intermediate frequency; and wherein the signal with reduced frequency is generated such that the reduced frequency and the sampling frequency are spaced such that the sampling theorem is at least fulfilled for the first odd-numbered harmonic of the signal with the reduced frequency.

In accordance with a third aspect, a computer program may include a program code for performing the above-mentioned method for processing an HF input signal, when the computer program runs on a computer.

The present invention is particularly suited for application in the field of the digital FM demodulator concept (FM frequency modulation). The present invention is based on the knowledge that in the case of a receiver architecture for frequency-modulated signals (FM signals) based on a digital frequency modulator, which operates at a sampling frequency close to an intermediate frequency (IF) of an IF signal, a low bit error rate can be achieved when the intermediate frequency is scaled down prior to sampling by using a frequency divider, particularly an asynchronous frequency divider. By using the frequency divider and the reduction of the intermediate frequency, it is possible to use a 1 bit analog/digital converter as sampler. Dividing down the intermediate frequency to a frequency with a frequency reduced compared with the intermediate frequency has the effect that also in the case of subsampling, the sampling theorem or the Nyquist Shannon sampling theorem, respectively, is not violated for those higher harmonics, which provide a significant contribution to a signal with the frequency reduced compared with the intermediate frequency. In other words, in this case, sampling with a sampling frequency or system frequency, respectively, causes no violation of the sample theorems for higher harmonics.

According to an embodiment, the division of the frequency of this signal to be sampled with the help of a frequency divider, particularly an asynchronous frequency divider, enables the flexible usage of an architecture based on the approach of subsampling, which is normally only applicable in a limited frequency constellation of sampling frequency and the frequency of the signal to be sampled or the IF signal, respectively.

Especially in the case where the signal to be sampled is generated or formed by a limiting circuit, so that apart from the fundamental wave or basic wave, respectively, all odd-numbered harmonics or harmonic waves exist in the frequency spectrum or the frequency distribution, respectively, of the signal to be sampled, the usage of a frequency divider and thus dividing down the frequency of the signal to be sampled or the IF signal, respectively, to a frequency reduced compared with the intermediate frequency, offers the possibility that the sampling theorem is not even violated for higher harmonics, whose contribution is significant. Thus, in the frequency distribution of the output signal of the sampling means, large distances result in the frequency range between the contributions, which can be attributed to different harmonics of the intermediate frequency. Thereby, digital filters with poorer power or filter characteristics, respectively, can be used for postprocessing the sampled signal. Above that, deviations and fluctuation of the IF signal (deviation and phase jitter) are reduced, and heavy distortions of a following demodulation and FSK signal detection and a resulting high bit error rate are reduced (FSK=frequency shift keying).

Figure 2:
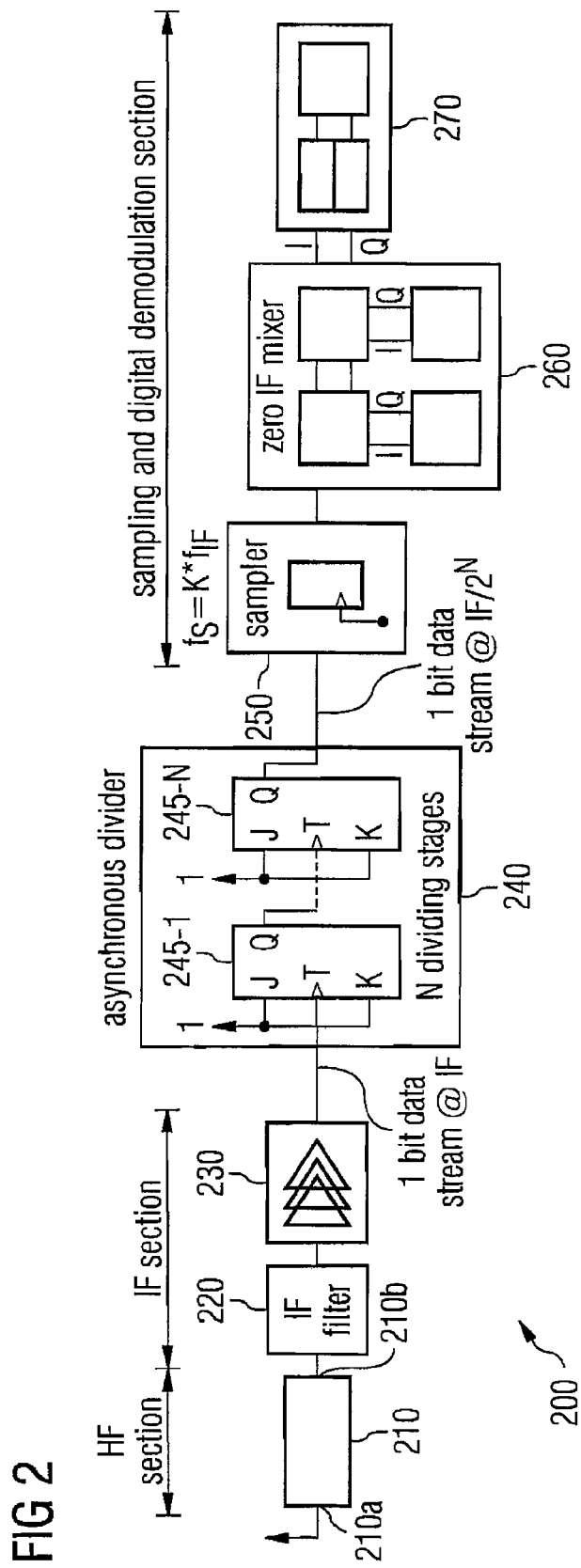
FIG. 2 is a block diagram of a second embodiment of a signal processing circuit.
Figure 3:
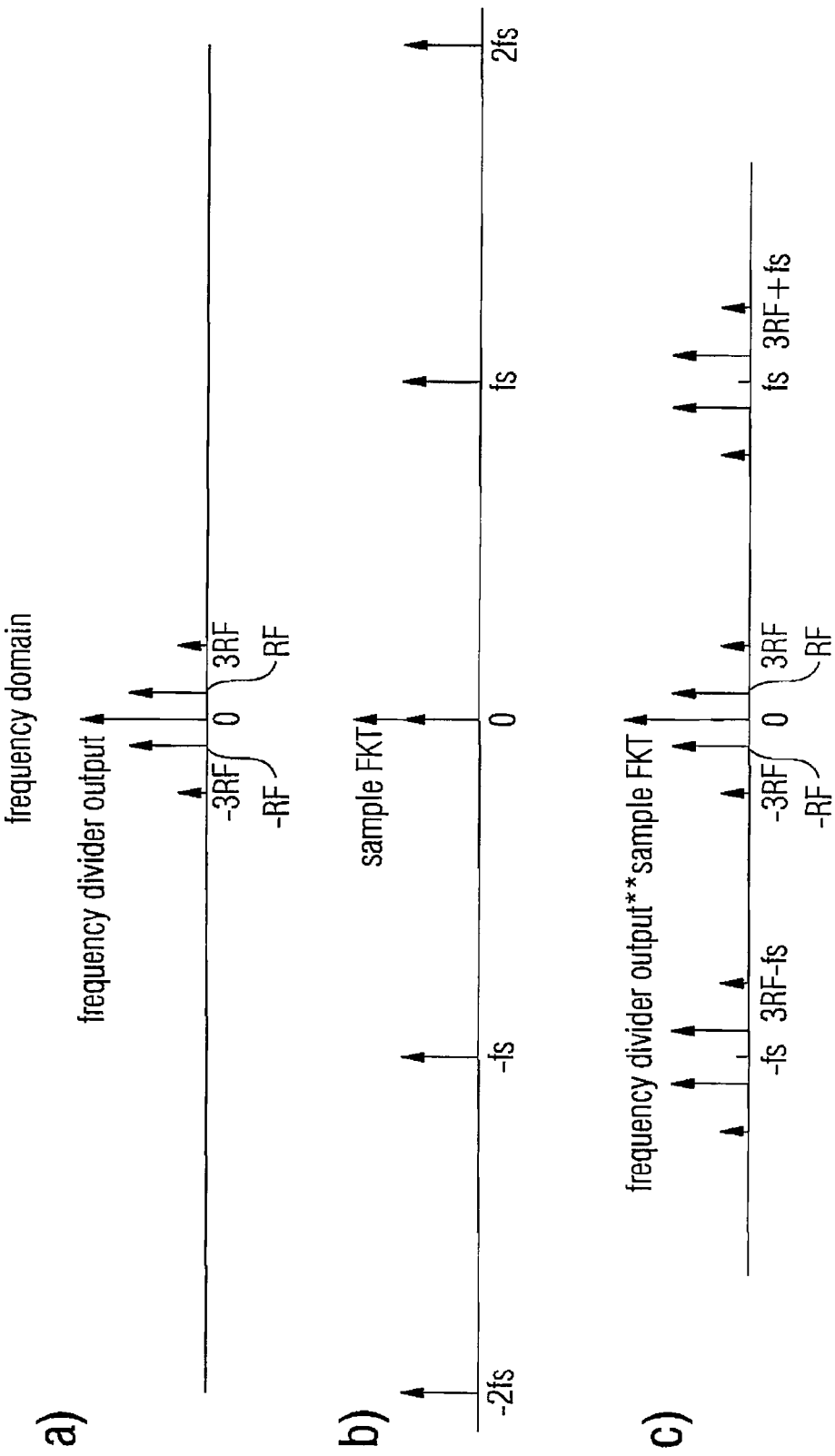
FIG. 3 is a frequency plan compared with the second embodiment.

Compared with FIGS. 1 to 3, a first embodiment for signal processing is described. In FIGS. 1 to 3, similar reference numbers are used for objects that are included in FIGS. 4 to 5 in similar form.

FIG. 1 shows a signal processing circuit 100, which has an HF receiving means 110, wherein the abbreviation HF stands for high frequency. Thereby, an HF input signal is supplied to an input 110a of the RF receiving means 110. The HF receiving means 110 provides an IF signal with an intermediate frequency (IF) at an output 110b, which is provided to an input of a frequency divider 140. The frequency divider 140 provides a signal with reduced frequency at an output, which is supplied to a sampling means 150 at an input of the same.

The RF receiving means 110 generates an IF signal on an intermediate frequency from the RF input signal applied to its input 110a, and provides the same at its output 110b. The IF signal provided at the output 110b of the HF receiving means 110 is supplied to the input of the frequency divider 140. The frequency divider 140 comprises two flip flops 145-1 and 145-2, for example JK flip flops, wherein the input of the frequency divider 140 is connected to an input T of the JK flip flop 145-1. The input T of the JK flip flop 145-1 represents the terminal for a clock signal of the JK flip flop. Additionally, the JK flip flop 145-1 has an input J and an input K, which are both connected to a voltage source not shown in FIG. 1, which provides a voltage signal to the JK flip flop 145-1, which corresponds to a logic state high. Thereby, a voltage signal applied to an output Q of the JK flip flop 145-1 changes with every falling edge of the signal applied to the input T of the JK flip flop between a first voltage signal corresponding to a logic high, and a second voltage value corresponding to a logic low. The second JK flip flop 145-2 is connected to an input J and an input K, also at a voltage source with a voltage value corresponding to a logic high, and which is not shown in FIG. 1. The output Q of the JK flip flop 145-1 is connected to an input T of the second JK flip flop 145-2. An output Q of the second JK flip flop is connected to the output of the frequency divider 140. By connecting the two JK flip flops 145-1 and 145-2 in series, a signal with reduced frequency is generated at the output of frequency divider 140, wherein the frequency of the signal with the reduced frequency corresponds to a quarter of the frequency of the IF signal. Above that, the frequency divider 140 converts the IF signal, as long as the same has a corresponding wave form, which means particularly corresponding signal values, into a square wave signal. The signal with the reduced frequency is then provided to the sampling means 150 at the input of the sampling means 150 with a sampling frequency $f_s$. Then, the sampled signal is available for further processing at an output of the sampling means 150.

FIG. 2 shows a further embodiment of a signal processing circuit 200 for processing an HF input signal. The signal processing circuit 200 has an analog input circuit (frontend) 210 with an input 210a and an output 210b. The output 210b of the analog front end 210 is coupled to an input of an intermediate frequency filter (IF filter) 220. An output of the IF filter 220 is coupled to an input of limiting circuit 230, which provides a signal designated as 1 bit data current@IF at an output. The IF filter and the limiter 230 provide signal shaping of the IF signal, wherein a square wave-like signal curve is present at the output of the limiter 230. The output of the limiting circuit 230 is connected to an input of an asynchronous frequency divider 240. The frequency divider 240 comprises a series connection of a number of N different JK flip flops 245-1 to 245-N, wherein the inputs J and K of JK flip flops are connected to a voltage source not shown in FIG. 2, which provides a voltage to the JK flip flops, which corresponds to a logic high. The input of the frequency divider 240 is thereby connected to the input T of the JK flip flop 245-1. An output Q of the Nth JK flip flop 245-1 is connected to an output of the frequency divider 240. With the exception of the first JK flip flop 245-1, all inputs T of the downstream JK flip flop are always connected to an output Q of the previous JK flip flop. Thus, the frequency divider 240 has all in all N divider stages, each of them dividing the frequency in half, so that overall a signal with a reduced frequency is provided at the output of the frequency divider 240, with a frequency lower by a factor $2^N$ compared with the digital IF signal. The signal with reduced frequency is also indicated as 1 bit data current at $IF/2^N$ in FIG. 2. The JK flip flops 245-1 to 245-N consider the square wave signals applied to the input of the frequency divider 240 as digital signals.

The output of the frequency divider 240 is connected to an input of a sampling means 250, which is also designated as sampler in FIG. 2, which samples the signal with a sampling frequency $f_s$. According to an embodiment, the sampling means can be implemented by a 1 bit A/D converter. An output of the sampling means 250 is coupled to an input of a zero IF mixer 260. A filter and demodulation circuit 270 is connected downstream of the zero IF mixer 260. Both the zero IF mixer 260 and the filter and demodulation circuit 270 can correspond to the zero IF mixer 860 and the filter and demodulation circuit 870 shown in FIG. 4. Thus, regarding to the description of these elements, reference can be made to the above description of FIG. 4.

Thus, overall, the signal processing circuit 200 shown in FIG. 2 has an HF range comprising the analog front end 210, an IF range comprising the IF filter 220 and the limiting circuit 230, and a sampling and digital demodulation range comprising the sampling means 250, the zero IF mixer 260 and the filter and demodulation circuit 270.

Figure 4:
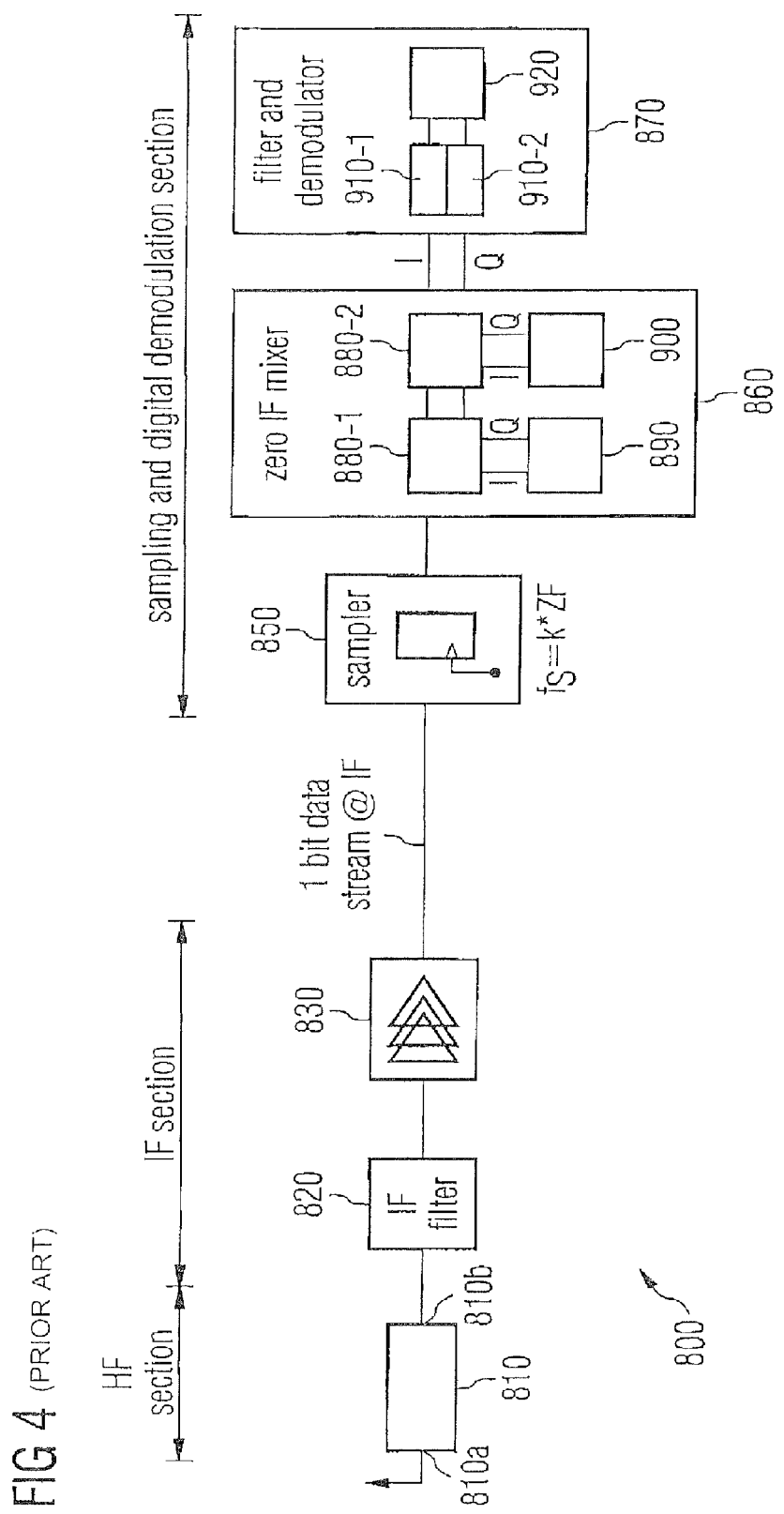
FIG. 4 is a digital FM demodulation circuit.

The embodiment of a signal processing circuit 200 shown in FIG. 2 differs from the approach of a signal processing circuit 800 shown in FIG. 4 particularly by the frequency divider 240 connected between the limiting circuit 230 and the sampling means 250, which has N sampling stages in the present embodiment. Each of the N sampling stages reduces the frequency of the digital IF signal by a factor of 2, so that the frequency of the signal with the reduced frequency is reduced by a factor of $2^N$ at the output of the frequency divider. In other words, the signal processing circuit 200 has an asynchronous intermediate frequency divider 240 in an FM demodulation system, which receives the output signal of a limiter 230 and has a sampling rate close to the intermediate frequency (<2·IF). By using the frequency divider 240 in the signal processing circuit 200, the occurrence of heavy distortions in the demodulation following sampling and thus the occurrence of a high bit error rate can be avoided in comparison with the signal processing circuit 800 shown in FIG. 4.

For discussing the mode of operation and the influence of the frequency divider 240 on the signal processing circuit 200 and signals occurring in the signal processing circuit 200, a frequency plan in the frequency domain of three signals occurring in the signal processing circuit 200 is shown schematically in FIG. 3. Thereby, similar to FIG. 5, the frequency axes are scaled identically and are not illustrated displaced towards each other. A comparison of frequencies is thus possible by vertically displacing the contributions at the respective frequency between the subfigures. FIG. 3a shows the frequency distribution of the signal with reduced frequency at the output of the frequency divider 240, wherein the frequency divider 240 has N=3 divider stages in this example, so that a frequency division ratio of $2^{3=8}$ results. The signal with reduced frequency has a fundamental frequency RF, while the first odd-numbered harmonic has the frequency 3RF. FIG. 3b shows the frequency distribution of the sampling function, which uses the sampling means 250, wherein $f_s$ is the sampling frequency of the sampling means 250. Further harmonics, particularly further odd-numbered harmonic portions, which are a result of the square wave signal due to the limiting circuit 830, are not shown for clarity reasons. FIG. 3c shows the frequency distribution at the output of the sampling means 250, which is a result of the convolution of the signal with reduced frequency at the input of the sampling means 250 or at the output of the frequency divider 240, respectively, and the sampling function (Sample FKT) of the sampling means 250. By using the frequency divider 240 and the reduction of the frequency in connection therewith, the sampling theorem or the Nyquist Shannon sampling theorem, respectively, is fulfilled for the signal with reduced frequency. Thereby, the following FM demodulation and the reconstruction of the data and the FSK signal detection (FSK frequency shift keying) is not disturbed, which causes a reduction of the bit error rate.

In other words, if, for example, the intermediate frequency at the output of the limiting circuit 230 has a frequency in the range between 10.7 MHz and 10.8 MHz, the frequency of the signal with reduced frequency has a frequency in the range between 1.325 and 1.3625 MHz at the output of the frequency divider 240, which has three dividing stages and thus reduces the frequency by a factor $2^3=8$. The position in the frequency domain of the third harmonics, which means the first odd-numbered harmonic, is thus in the frequency range between 3.975 MHz and 4.0875 MHz. For sampling frequencies or system frequencies, respectively, of the overall system in the range between 13.1 MHz to 14.5 MHz, the sampling in this case with the system frequency leads to no violation of the sampling theorem for higher harmonic contributions, particularly for the first odd-numbered harmonic. In this case, which means at a system frequency in the range between 13.1 MHz and 14.5 MHz, the first harmonic which can disturb the fundamental wave is the ninth harmonic. Due to the large distance in the frequency range or in the frequency domain, respectively, between the fundamental wave and the higher harmonic, it is easy to filter the spectrum after sampling with a digital filter with low performance.

Above that, the reduction of the frequency of the IF signal by the frequency divider 240 has further advantages. One of these is particularly that the deviation and the fluctuation of the IF signal (deviation and phase jitter) is also reduced by the frequency dividing ratio, in the present case of a three-stage frequency divider 240 also by a factor of $2^{3=8}$. Thereby, it is possible to design the further mixer circuit 260 and the filter and demodulation circuit 270 with a demodulation characteristic with a narrower bandwidth. If, for example, the input bandwidth of the signal prior to the frequency divider 240 is at +/−250 kHz, the output bandwidth at the output of the asynchronous frequency divider 240 is +/−31.25 kHz. The division of the deviation caused by the frequency divider 240 and already mentioned above is almost compensated by the steeper rise of the demodulation characteristic by the possibility to reduce the cut-off frequencies of the two CIC low-pass filters.

As has already been mentioned above, the harmonics of the IF signal can interfere with the data reconstruction and the FSK signal detection (frequency shift keying). According to an embodiment, the harmonics are no longer convoluted to the fundamental wave, since the sampling theorem is not violated for the third harmonic or the first odd-numbered harmonic, respectively, and is hardly violated for the fifth harmonic or the second odd-numbered harmonic. Higher harmonics have an amplitude difference compared with the fundamental wave of more than 16.9 decibel, so that their contribution can be neglected. Above that, the characteristics of the overall system are influenced by the modulation index and depend further on the resolution of the data stream or the data path, respectively.

Although in the shown embodiments, asynchronous frequency dividers with a frequency division ratio $2^N$, wherein N is the number of the divider stages of the asynchronous frequency dividers 140, 240 shown in FIGS. 1 and 2, are used as frequency dividers, the present invention is not limited to such circuits. Rather, frequency dividers with a deviating frequency division ratio can be used. However, possible embodiments of such frequency dividers frequently require additional circuit elements such as, for example, logic OR gates, logic AND gates or logic NOT gates, wherein the logic gates are used for controlling the control inputs J and K of the JK flip flops in dependence of the states of the JK flip flops. In this way, for example, a frequency divider can be realized with a division ratio of 6:1. Additionally, the frequency divider 140, 240 can also be designed as synchronous frequency divider. A possible embodiment of a synchronous frequency divider is based on a synchronous dual counter, which has a plurality of toggle flip flops.

Although 1 bit converters or 1 bit A/D converters, respectively, have been used as sampling means in the shown embodiment, this represents no limitation of the present invention. Rather, sampling means with a higher number of bits can be used.

In dependence on the circumstances, the method for processing an HF input signal can be implemented in hardware or in software. The implementation can be made on a digital memory medium, particularly a disc, CD or DVD with electronically readable control signals, which can cooperate with a programmable computer system such that the respective method is performed. Thus, generally, the invention consists also of a computer program product with a program code stored on a machine-readable carrier by performing the method when the computer program product runs on a computer. In other words, the invention can be realized as a computer program with a program code for performing the method when the computer program runs on a computer.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A signal processing circuit, comprising:
a high frequency (HF) receiver for receiving a frequency modulated HF input signal and for generating an intermediate frequency (IF) signal having an intermediate frequency from the frequency modulated HF input signal, wherein the intermediate frequency is smaller than a frequency of the frequency modulated HF input signal;
a frequency divider for generating a signal from the IF signal or a signal derived from the IF signal, the generated signal having a reduced frequency that is smaller than the intermediate frequency; and
a sampler for sampling the generated signal with the reduced frequency by a sampling frequency, wherein the sampling frequency is smaller than twice the intermediate frequency;
wherein the frequency divider divides the intermediate frequency such that the reduced frequency and the sampling frequency are spaced from one another in terms of frequency such that a sampling theorem is fulfilled at least for the first odd-numbered harmonic of the generated signal with the reduced frequency.

2. The signal processing circuit according to claim 1, wherein the frequency divider has an asynchronous frequency divider.

3. The signal processing circuit according to claim 1, wherein the frequency divider has a predetermined frequency division ratio.

4. The signal processing circuit according to claim 3, wherein the frequency division ratio is given by a factor $2^N$ with a natural number N.

5. The signal processing circuit according to claim 1, wherein the frequency divider has a plurality of JK flip flops.

6. The signal processing circuit according to claim 1, wherein the sampler is part of a digital frequency modulated (FM) demodulation circuit.

7. The signal processing circuit according to claim 6, wherein a zero IF mixer and a filter and demodulation unit are downstream of the sampler.

8. The signal processing circuit according to claim 1, wherein a signal shaper for generating the signal derived from the IF signal is connected between the HF receiver and the frequency divider.

9. The signal processing circuit according to claim 8, wherein the signal shaper comprises a series connection of a filter stage and a limiter stage.

10. The signal processing circuit according to claim 9, wherein the series connection of the filter stage and the limiter stage signal-shapes the intermediate frequency signal and provides an output signal having a square wave-like signal curve.

11. The signal processing circuit according to claim 1, wherein the sampler is formed by a 1 bit analog/digital converter.

12. The signal processing circuit according to claim 1, wherein the limiter stage is configured to provide a 1-bit data stream at the intermediate frequency as a limiter stage output signal.

13. The signal processing circuit of claim 1, wherein the reduced frequency and the sampling frequency are spaced in frequency such that the first odd-numbered harmonic of the generated signal having the reduced frequency is smaller in frequency than twice the sampling frequency.

14. A method for processing a frequency modulated high frequency (HF) input signal in a signal processing circuit, comprising:
receiving a frequency modulated HF input signal and generating an intermediate frequency (IF) signal having an intermediate frequency, from the frequency modulated HF input signal, wherein the intermediate frequency is smaller than a frequency of the frequency modulated HF input signal;
generating a signal from the IF signal or a signal derived from the IF signal, the generated signal having a reduced frequency that is smaller than the intermediate frequency; and
sampling the generated signal with the reduced frequency by using a sampling frequency, wherein the sampling frequency is smaller than twice the intermediate frequency;
wherein the signal with reduced frequency is generated such that the reduced frequency and the sampling frequency are spaced from one another in terms of frequency such that the sampling theorem is at least fulfilled for the first odd-numbered harmonic of the generated signal with the reduced frequency.

15. The method of claim 14, wherein generating the signal with reduced frequency is performed by using a predetermined frequency division ratio.

16. The method of claim 15, wherein the frequency division ratio is given by $2^N$ with a natural number N.

17. The method according to claim 14, further comprising shaping the IF signal for generating a signal derived from the IF signal.

18. The method according to claim 17, wherein shaping the IF signal comprises filtering and limiting.

19. The method according to claim 14, further comprising demodulating the signal obtained in sampling.

20. The method of claim 14, wherein the reduced frequency and the sampling frequency are spaced in frequency such that the first odd-numbered harmonic of the generated signal having the reduced frequency is smaller in frequency than twice the sampling frequency.

21. A computer program product storing a program code on a non-transitory computer readable medium which when executed on a computer performs a method for processing a frequency modulated high frequency (HF) input signal in a signal processing circuit, comprising:
receiving a frequency modulated HF input signal and generating an IF signal having an intermediate frequency, from the frequency modulated HF input signal, wherein the intermediate frequency is smaller than a frequency of the frequency modulated HF input signal;
generating a signal from the IF signal or a signal derived from the IF signal, the generated signal having a reduced frequency that is less than the intermediate frequency; and sampling the generated signal with the reduced frequency by using a sampling frequency, wherein the sampling frequency is smaller than twice the intermediate frequency;

wherein the signal with reduced frequency is generated such that the reduced frequency and the sampling frequency are spaced from one another in terms of frequency such that the sampling theorem is at least fulfilled for the first odd-numbered harmonic of the generated signal with the reduced frequency.

22. The computer program product according to claim 21, wherein generating the signal with reduced frequency is performed by using a predetermined frequency division ratio.

23. The computer program product according to claim 22, wherein the frequency division ratio is given by $2^N$ with a natural number N.

24. The computer program product according to claim 21, further comprising shaping the IF signal for generating a signal derived from the IF signal.

25. The computer program product according to claim 20, wherein shaping the IF signal comprises a step of filtering and a step of limiting.

26. The computer program product according to claim 21, further comprising demodulating the signal obtained in sampling.

27. The computer program product according to claim 21, wherein the reduced frequency and the sampling frequency are spaced in frequency such that the first odd-numbered harmonic of the generated signal having the reduced frequency is smaller in frequency than twice the sampling frequency.

28. A frequency-modulated signal demodulation system, comprising:
  a signal processing circuit, comprising:
    a high frequency (HF) receiver for receiving a frequency modulated HF input signal and for generating an intermediate frequency (IF) signal having an intermediate frequency from the frequency modulated HF input signal, wherein the intermediate frequency is smaller than a frequency of the frequency modulated HF input signal;
    a frequency divider for generating a signal from the IF signal or a signal derived from the IF signal, the generated signal having a reduced frequency that is smaller than the intermediate frequency; and
    a sampler for sampling the generated signal with the reduced frequency by a sampling frequency, wherein the sampling frequency is smaller than twice the intermediate frequency;
  wherein the frequency divider divides the intermediate frequency such that the reduced frequency and the sampling frequency are spaced from one another in terms of frequency such that a sampling theorem is fulfilled at least for the first odd-numbered harmonic of the generated signal with the reduced frequency.

29. The frequency-modulated signal demodulation system of claim 28, wherein the reduced frequency and the sampling frequency are spaced in frequency such that the first odd-numbered harmonic of the generated signal having the reduced frequency is smaller in frequency than twice the sampling frequency.

* * * * *